US010862491B2

(12) United States Patent
Berthoud

(10) Patent No.: US 10,862,491 B2
(45) Date of Patent: Dec. 8, 2020

(54) METHOD AND APPARATUS FOR INCREASING AN OPERATION LIFETIME OF A BEAM TUBE

(71) Applicant: ADVA Optical Networking SE, Meiningen OT Dreissigacker (DE)

(72) Inventor: Patrick Berthoud, Preles (CH)

(73) Assignee: ADVA OPTICAL NETWORKING SE, Meiningen OT Dreissigacker (DE)

( * ) Notice: Subject to any disclaimer, the term of this patent is extended or adjusted under 35 U.S.C. 154(b) by 0 days.

(21) Appl. No.: 16/537,154

(22) Filed: Aug. 9, 2019

(65) Prior Publication Data

US 2020/0059238 A1     Feb. 20, 2020

(30) Foreign Application Priority Data

Aug. 14, 2018   (EP) ..................................... 18188860

(51) Int. Cl.
    *H03L 7/26*        (2006.01)
    *G04F 5/14*        (2006.01)
    *H01J 37/244*   (2006.01)

(52) U.S. Cl.
    CPC ................... *H03L 7/26* (2013.01); *G04F 5/14* (2013.01); *H01J 37/244* (2013.01)

(58) Field of Classification Search
    CPC .. H03L 7/26; G04F 5/14; H01J 49/025; H01J 49/0009; H01J 37/244; H01J 43/04; H01J 43/30
    See application file for complete search history.

(56) References Cited

U.S. PATENT DOCUMENTS 3,387,130 A * 6/1968 Lacey ...................... H05H 3/00
                                                      250/251
5,146,184 A * 9/1992 Cutler ...................... H03L 7/26
                                                       331/3

(Continued)

FOREIGN PATENT DOCUMENTS

CN      107065502 A   *   8/2017
CN      107065502 A      8/2017

OTHER PUBLICATIONS

Lutwak, R., et al. Optically pumped cesium-beam frequency standard for GPS-III. Datum-Timing Test and Measurement Beverly MA, 2001. (Year: 2001).*

(Continued)

*Primary Examiner* — Ryan Johnson
(74) *Attorney, Agent, or Firm* — Jenkins, Wilson, Taylor & Hunt, P.A.

(57) ABSTRACT

A method and apparatus for increasing the operation lifetime of a beam tube are provided. The method includes converting an electrical current output by the beam tube into an intermediate voltage to provide a voltage signal used for changing an electron multiplier polarization voltage applied to an electron multiplier by a power supply unit controlled by an electron multiplier gain control signal generated by a controller. The controller regulates the electrical current output by the beam tube to keep it below a characteristic current threshold by adjusting the electron multiplier gain control signal until it reaches a predefined maximum value. The voltage signal applied to the controller is regulated by increasing the variable gain of a voltage amplifier to compensate for a drop in electrical current output by the beam tube caused by the aging of the electron multiplier until the applied voltage signal reaches a predefined minimum value.

16 Claims, 4 Drawing Sheets

(56) References Cited

U.S. PATENT DOCUMENTS 9,197,230 B2 * 11/2015 Tanaka .................. H03L 1/00
2009/0206247 A1 8/2009 Holle

OTHER PUBLICATIONS

Extended European Search Report for European Application Serial No. 18188860.3 (dated Feb. 25, 2019).
Kusters et al., "Long-Term Experience with Cesium Beam Frequency Standards," 1999 Joint Meetng EFTF—IEEE IFCS, pp. 159-163 (1999).

* cited by examiner

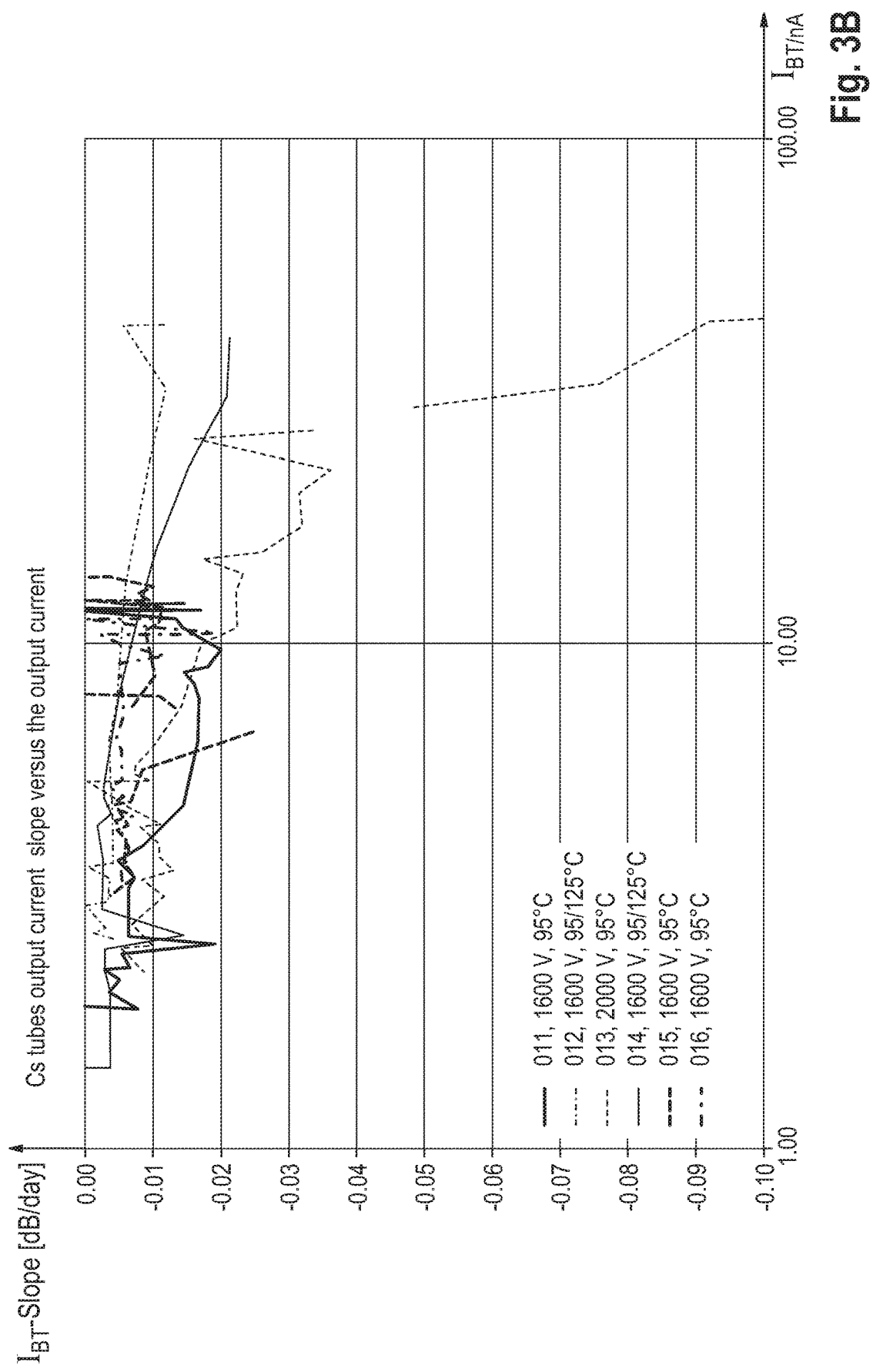

METHOD AND APPARATUS FOR INCREASING AN OPERATION LIFETIME OF A BEAM TUBE

PRIORITY CLAIM

This application claims the benefit of European Patent Application No. 18188860.3, filed Aug. 14, 2018, the disclosure of which is incorporated herein by reference in its entirety.

TECHNICAL FIELD

The invention relates to a method and apparatus for increasing an operation lifetime of a beam tube, in particular a cesium beam tube of an atomic clock device having an electron multiplier which amplifies a received ionic current with an electron multiplier gain to provide an electrical current output by the beam tube.

BACKGROUND

An atomic clock device provides highly accurate and stable reference electrical oscillation signals. An atomic clock device can be used in a wide range of applications and technical fields such as telecommunication, navigation, meteorology, timescale, etc. The atomic clock device can comprise a beam tube including a microwave cavity and an electron multiplier controlled by an electronic apparatus.

The amplification gain of the electron multiplier within the beam tube has an impact on the operation lifetime of the beam tube. If the amplification gain of the aging electron multiplier becomes too weak the electronic circuit or apparatus controlling the beam tube can no longer compensate for a drop of the electrical output by the beam tube. This results in a premature clock lifetime reduction although the neutral atomic beam flux of the microwave cavity within the beam tube might still be sufficient.

Accordingly, there is a need to provide a method and an apparatus for increasing the operation lifetime of a beam tube having an electron multiplier, in particular a method and an apparatus for increasing the operation lifetime of a beam tube used in an atomic clock device.

SUMMARY

The invention provides according to the first aspect of the present invention a method for increasing the operation lifetime of a beam tube having an electron multiplier which amplifies a received ionic current with an electron multiplier gain to provide an electrical current output by the beam tube, wherein the electrical current output by said beam tube is regulated by a controller to compensate for the electron multiplier aging and to keep it below a characteristic current threshold by adjusting an electron multiplier gain control signal until it reaches a predefined maximum value.

The method comprises in a possible embodiment the steps of:
converting the electrical current output by the beam tube into an intermediate voltage amplified by a voltage amplifier with a variable gain to provide a voltage signal used for a further processing and applied to a controller,
adjusting the electron multiplier gain of the electron multiplier by changing an electron multiplier polarization voltage applied to the said electron multiplier by a power supply unit controlled by an electron multiplier gain control signal generated by the controller,
regulating by the controller the electrical current output by the beam tube to compensate for the electron multiplier aging and to keep it below a characteristic current threshold by adjusting the electron multiplier gain control signal until it reaches a predefined maximum value and
regulating by the controller the voltage signal applied to the controller by increasing the variable gain of the voltage amplifier to compensate for a further drop of the electrical current output by the beam tube caused by aging of the electron multiplier until the voltage signal applied to the controller reaches a predefined minimum value.

In a possible embodiment of the method according to the first aspect of the present invention, the characteristic current threshold is less than 10 nAmps, in particular 5 nAmps.

The invention further provides according to a further second aspect an apparatus adapted to increase an operation lifetime of a beam tube comprising the features of claim 7.

The invention provides according to the second aspect an apparatus adapted to increase an operation lifetime of a beam tube having an electron multiplier which is adapted to amplify a received ionic current with an electron multiplier gain to provide an electrical current output by the said beam tube, the said apparatus comprising a controller adapted to regulate the electrical current output by the said beam tube to compensate for the electron multiplier aging and to keep it below a characteristic current threshold by adjusting an electron multiplier gain control signal until it reaches a predefined maximum value.

The apparatus comprises in a possible embodiment a trans-impedance amplifier adapted to convert the electrical current output by the beam tube into an intermediate voltage amplified by a voltage amplifier of the apparatus with a variable gain to provide a voltage signal used for further processing and applied to a controller of the apparatus,
wherein the controller is adapted to adjust the electron multiplier gain of the electron multiplier by changing an electron multiplier polarization voltage applied to the said electron multiplier by a power supply unit of the said apparatus in response to an electron multiplier gain control signal generated by the controller and
wherein the controller is further adapted to regulate the electrical current output by the said beam tube to keep it below a characteristic current threshold by adjusting the electron multiplier gain control signal until it reaches a predefined maximum value and then to regulate the applied voltage signal by increasing the variable gain of the voltage amplifier to compensate for a drop of the electrical current output by the beam tube caused by the aging of its electron multiplier until the voltage signal applied to the said controller reaches a predefined minimum value.

In a possible embodiment of the apparatus according to the second aspect of the present invention, the characteristic current threshold is stored in a configuration memory of the said apparatus and/or stored in a configuration memory of the said beam tube.

In a further possible embodiment of the apparatus according to the second aspect of the present invention, the characteristic current threshold is less than 10 nAmps, in particular 5 nAmps.

In a further possible embodiment of the apparatus according to the second aspect of the present invention, the controller is further adapted to generate a control signal supplied to a microwave frequency synthesizer of the said apparatus adapted to generate a microwave frequency signal applied to a microwave cavity of the beam tube.

In a still further possible embodiment of the apparatus according to the second aspect of the present invention, the microwave frequency synthesizer of the apparatus provides an atomic clock output signal by the said apparatus to a user.

In a still further possible embodiment of the apparatus according to the second aspect of the present invention, the trans-impedance amplifier of the apparatus comprises a fixed gain.

In a still further possible embodiment of the apparatus according to the second aspect of the present invention, the beam tube comprises an oven adapted to provide a continuous atomic beam flux of atoms supplied to a state preparation magnet of the beam tube adapted to deflect selectively atoms of the atomic beam flux into a microwave cavity of the said beam tube receiving the microwave frequency signal from the microwave frequency synthesizer of the apparatus controlled in response to a control signal generated by the controller of the said apparatus.

In a still further possible embodiment of the apparatus according to the second aspect of the present invention, the atoms of the atomic beam flux deflected by the said state preparation magnet into the microwave cavity of the said beam tube are supplied to a state detection magnet of the said beam tube adapted to deflect selectively atoms of the atomic beam flux to an ionization detector of the said beam tube.

In a still further possible embodiment of the apparatus according to the second aspect of the present invention, an atomic beam flux supplied by the state detection magnet of the beam tube to the ionization detector of the beam tube is converted by the ionization detector into an ionic current of charged ions amplified by the electron multiplier of the beam tube.

In a still further possible embodiment of the apparatus according to the second aspect of the present invention, the ionic current of charged ions is amplified by the electron amplifier of the beam tube with an electron multiplier gain adjusted by the controller of the said apparatus by changing the electron multiplier polarization voltage to provide the electrical current output by the beam tube.

The invention further provides according to a further third aspect an atomic clock device comprising a beam tube and an apparatus according to the second aspect of the present invention adapted to increase the operation lifetime of the beam tube.

In a possible embodiment of the atomic clock device according to the third aspect of the present invention, the beam tube comprises a cesium beam tube.

In a still further possible embodiment of the atomic clock device according to the third aspect of the present invention, the beam tube and/or the apparatus according to the second aspect of the present invention comprise a configuration memory which stores a characteristic current threshold used by the controller of the apparatus to regulate the electrical current output by the beam tube of the atomic clock device.

BRIEF DESCRIPTION OF FIGURES

In the following, possible embodiments of the different aspects of the present invention are described in more detail with reference to the enclosed figures.

FIGS. 3A, 3B show diagrams for illustrating the operation of a method and apparatus for increasing an operation lifetime of a beam tube according to the present invention.

DETAILED DESCRIPTION OF EMBODIMENTS

Figure 1:
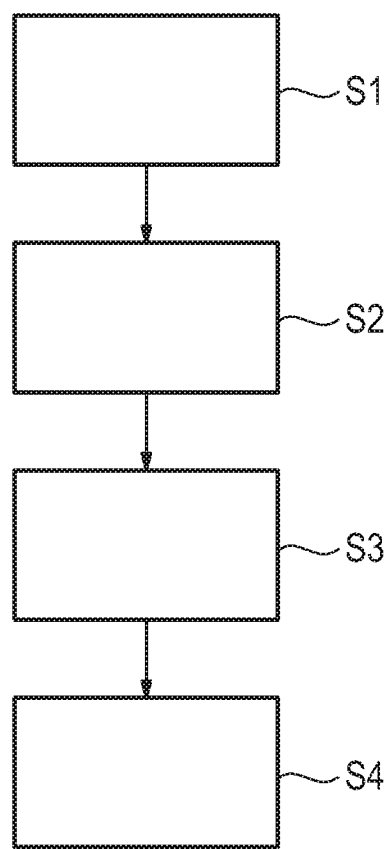
FIG. 1 shows a flowchart of a possible exemplary embodiment of a method for increasing an operation lifetime of a beam tube according to the first aspect of the present invention.
Figure 2:
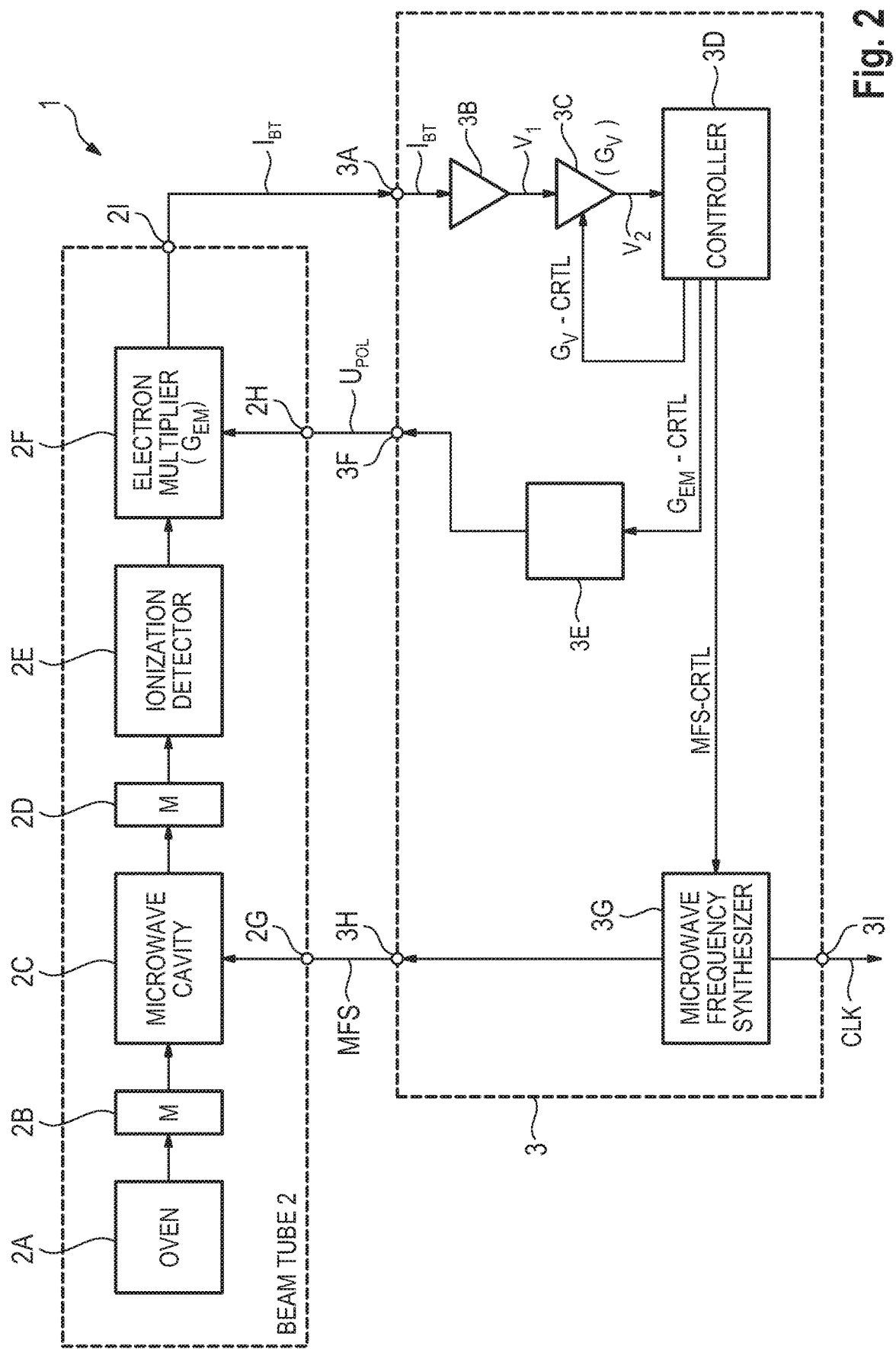
FIG. 2 shows a block diagram of a possible exemplary embodiment of an atomic clock device according to the third aspect of the present invention comprising a beam tube and an electronic apparatus according to the second aspect of the present invention.

As can be seen in the flowchart of FIG. 1, the method of increasing an operation lifetime of a beam tube 2 according to the first aspect of the present invention can comprise in the illustrated exemplary embodiment several main steps. The method illustrated in FIG. 1 is provided for increasing an operation lifetime of a beam tube, in particular a cesium beam tube, having an electron multiplier which amplifies a received ionic current with an electron multiplier gain to provide an electrical current output by the beam tube as also illustrated in FIG. 2.

In the illustrated exemplary embodiment, the method comprises four main steps S1, S2, S3, S4.

In a first step S1, the electrical current $I_{BT}$ output by the beam tube is converted into an intermediate voltage $V_1$ amplified by a voltage amplifier with a variable gain $G_v$ to provide a voltage signal $V_2$ used for further processing and applied to a controller.

In a further step S2, the electron multiplier gain $G_{EM}$ of the electron multiplier is adjusted by changing an electron multiplier polarization voltage $U_{POL}$ applied to the electron multiplier of the beam tube by a power supply unit controlled by an electron multiplier gain control signal $G_{EM}$-CRTL generated by the controller.

In a further step S3, the electrical current $I_{BT}$ output by the beam tube is regulated by the controller to compensate for the electron multiplier aging (gain $G_{EM}$ decrease) and to keep it below a characteristic current threshold $I_{th}$ by adjusting the electron multiplier gain control signal $G_{EM}$-CRTL until it reaches a predefined maximum value.

In a further step S4, the voltage signal $V_2$ applied to the controller is regulated by the controller by increasing the variable gain $G_v$ of the voltage amplifier to compensate for a further drop of the electrical current $I_{BT}$ output by the beam tube caused by an aging of its electron multiplier until the applied voltage signal $V_2$ reaches a predefined minimum value.

The characteristic current threshold $I_{th}$ used in step S3 is in a preferred embodiment less than 10 nAmps. In a possible exemplary embodiment, the characteristic current threshold $I_{th}$ used in step S3 by the controller to regulate the electrical current output by the beam tube is 5 nAmps. In a possible embodiment, the characteristic current threshold $I_{th}$ can be stored in a configuration memory of an electronic apparatus connected to the beam tube or can be stored in an alternative embodiment in a configuration memory of the beam tube itself.

FIG. 2 shows a block diagram of a possible exemplary embodiment of an atomic clock device 1 including a beam tube 2 and an electronic apparatus 3 wherein the operation lifetime of the beam tube 2 is automatically increased using a method according to the first aspect of the present invention as illustrated in the flowchart of FIG. 1.

As can be seen in the block diagram of FIG. 2, an atomic clock device 1 comprises in the illustrated embodiment a beam tube 2 connected to an electronic apparatus 3. The apparatus 3 is adapted to increase the operation lifetime of the beam tube 2. The beam tube 2 is for instance a cesium beam tube CBT.

The beam tube 2 comprises in the illustrated embodiment of FIG. 2 an oven 2A adapted to provide a continuous atomic beam flux of atoms. The oven 2A can be for instance a cesium oven wherein cesium atoms effuse from the oven source 2A. The continuous atomic beam flux of atoms generated by the oven 2A is supplied to a state preparation magnet 2B of the beam tube 2. The state preparation magnet 2B is adapted to deflect one category of cesium atoms of the beam based on their internal ground state hyperfine energy levels. Beams can pass through the inhomogeneous magnetic field of the state preparation magnet 2B. The force experienced by a particular atom depends on the effective magnetic moment, hence upon its energy state and also upon the gradient of the applied magnetic field. Consequently, atoms are selectively deflected by the state preparation magnet 2B of the beam tube 2 into the microwave cavity 2C of the beam tube 2. The microwave cavity 2C probes the cesium clock microwave transition frequency which is the frequency reference signal for the atomic clock device. Two fields are present in the microwave cavity 2C, i.e. a so-called C-field and the microwave field resulting from multiplication and synthesis from a microwave frequency synthesizer 3G forming part of the electronic apparatus 3. The presence of the C-field, which is a steady-state low level field, causes the desired separation to exist in the cesium atoms energy levels. The magnetic component of the injected microwave field can interact with the atoms. If the frequency f is at a transition frequency then atoms flop to the other transition energy state. Since the effective magnetic moment is hereby reversed in its direction, the state preparation magnet 2B can selectively deflect flopped atoms to an ionization detector 2E. Accordingly, the state preparation magnet 2B of the beam tube 2 is adapted to deflect selectively atoms of the atomic beam flux into the microwave cavity 2C of the beam tube 2 receiving the microwave frequency signal MFS from the microwave frequency synthesizer (MFS) 3G of the electronic apparatus 3 controlled in response to a control signal MFS-CRTL generated by a controller 3D of the electronic apparatus 3. The atomic beam flux deflected by the state preparation magnet 2B into the microwave cavity 2C of the beam tube 2 is supplied to a state detection magnet 2D adapted to deflect selectively atoms of the atomic beam flux to an ionization detector 2E of the beam tube 2. The state detection magnet 2D is adapted to deflect one category of cesium atoms of the beam flux based on its internal ground state hyperfine energy levels. Cesium atoms that have undergone the proper interactions for the state preparation, the microwave probing and the state detection form the useful neutral atomic beam flux supplied to the ionization detector 2E. In order to electrically measure this neutral beam flux the ionization detector 2E converts the received cesium neutral atom flux into a cesium charged ion flux supplied to the electron multiplier 2F of the beam tube 2. The atomic beam flux supplied by the state detection magnet 2D of the beam tube 2 to the ionization detector 2E of the beam tube 2 is converted by the ionization detector 2E into an ionic current of charged ions amplified by the electron multiplier 2F of the beam tube 2. Since the ion flux is weak it is amplified by the electron multiplier 2F which can be made of several stages of discrete dynodes. The ionic current of charged ions is amplified by the electron amplifier 2F of the beam tube 2 with an electron multiplier gain $G_{EM}$ adjusted by a controller 3D of the electronic apparatus 3, in particular by changing an electron multiplier polarization voltage $U_{POL}$. The electron multiplier gain $G_{EM}$ or the current gain is adjustable by the electron multiplier polarization voltage $U_{POL}$ applied to the electron multiplier 2F.

The electron multiplier gain $G_{EM}$ can be for instance in a range from 10,000 to 100,000. The current signal $I_{BT}$ output by the electron multiplier 2F is supplied to an input 3A of the electronic apparatus 3 as illustrated in FIG. 2.

The beam tube 2 illustrated in the embodiment of FIG. 2 comprises in the illustrated embodiment two signal inputs 2G, 2H and a current output 21. The electrical current $I_{BT}$ provided by the beam tube 2 is output at its output terminal 21 to the electronic apparatus 3. The two signal inputs 2G, 2H of the beam tube 2 are provided to receive a microwave frequency signal MFS applied to the microwave cavity 2C of the beam tube 2 and to receive an electron multiplier polarization voltage $U_{POL}$ applied to the electron multiplier 2F of the beam tube 2.

The apparatus 3 is connected to the beam tube 2 and receives at its input 3A the electrical current $I_{BT}$ output by the beam tube 2. The apparatus 3 comprises a fixed gain trans-impedance amplifier 3B adapted to convert the electrical current $I_{BT}$ received from the beam tube 2 into an intermediate voltage $V_1$ amplified by a voltage amplifier 3C of the apparatus 3 with a variable gain $G_v$ to provide a voltage signal $V_2$ used for further processing and applied to a controller 3D of the apparatus 3. The controller 3D of the apparatus 3 is adapted to adjust the electron multiplier gain $G_{EM}$ of the electron multiplier 2F by changing an electron multiplier polarization voltage $U_{POL}$ applied to the said electron multiplier 2F by a power supply unit 3E of the apparatus 3 in response to an electron multiplier gain control signal $G_{EM}$-CRT', generated by the controller 3D. The electron multiplier polarization voltage $U_{POL}$ is output via a signal output 3F of the electronic apparatus 3 and applied via the signal input 2H of the beam tube 2 to the electron multiplier 2F. The electron multiplier gain control signal $G_{EM}$-CRTL is applied to the high voltage power supply unit 3E of the apparatus 3 which provides the electron multiplier polarization voltage $U_{POL}$ which polarizes the electron multiplier 2F of the beam tube 2. The electron multiplier gain control signal $G_{EM}$-CRTL generated by the controller 3D affects the electron multiplier gain $G_{EM}$ of the electron multiplier 2F which outputs more or less electrical current $I_{BT}$ and consequently affects the intermediate voltage $V_1$ output by the trans-impedance amplifier 3B and the final voltage signal $V_2$ output by the voltage amplifier 3C of the apparatus 3. The controller 3D is further adapted to regulate the electrical current $I_{BT}$ output by the beam tube 2 to compensate for the electron multiplier aging (gain $G_{EM}$ drop) and to keep it below a characteristic current threshold $I_{th}$ by adjusting the electron multiplier gain control signal $G_{EE}$-CRT', until it reaches a predefined maximum value and then to regulate the applied voltage signal $V_2$ by increasing the variable gain $G_v$ of the voltage amplifier 3C to further compensate for a drop of the electrical current $I_{BT}$ output by the beam tube 2 caused by the aging of its electron multiplier 2F until the voltage signal $V_2$ applied to the controller 3D reaches a predefined minimum value. The two control signals output by the controller 3D control the amplitude of the current and voltage signals. In a possible embodiment, the characteristic current threshold $I_{th}$ used by the controller 3D of the apparatus 3 can be stored in a local configuration memory of the apparatus 3 or can be read from a configuration memory of the beam tube 2. In a possible embodiment, the characteristic current threshold $I_{th}$ stored in the configuration memory is 5 nAmps.

The controller 3D of the apparatus 3 is further adapted to generate a control signal supplied to a microwave frequency synthesizer 3G. The microwave frequency synthesizer 3G of the apparatus 3 is adapted to generate a microwave frequency signal MFS output via terminal 3H of the apparatus 3 and supplied to the microwave cavity 2C of the beam tube 2 via the signal input 2G of the beam tube 2 as illustrated in FIG. 2. The microwave synthesizer 3G of the apparatus 3 is adapted to generate the microwave frequency signal MFS for the microwave cavity 2C of the beam tube 2. The microwave frequency synthesizer 3G of the apparatus 3 provides an atomic clock output signal of the apparatus 3 to a user at output 3I as also illustrated in FIG. 2.

The oven 2A of the beam tube 2 provides a continuous atomic beam flux of atoms supplied to the state preparation magnet 2B of the beam tube 2 which is adapted to deflect selectively atoms of the atomic beam flux into the microwave cavity 2C receiving the microwave frequency signal MFS from the microwave frequency synthesizer 3G of the apparatus 3 controlled in response to the control signal MFS-CRTL generated by the controller 3D of the apparatus 3. The atomic beam flux deflected by the state preparation magnet 2B into the microwave cavity 2C is supplied to the state detection magnet 2D of the beam tube 2 adapted to deflect selectively atoms of the atomic beam flux into the ionization detector 2E of the beam tube 2. The atomic beam flux supplied by the state detection magnet 2D of the beam tube 2 to the ionization detector 2E of the beam tube 2 is converted by the ionization detector 2E into an ionic current of charged ions amplified by the electron multiplier 2F of the beam tube 2. The ionic current of charged ions is amplified by the electron amplifier 2F of the beam tube 2 with an electron multiplier gain $G_{EM}$ adjusted by the controller 3D of the apparatus 3 by changing the electron multiplier polarization voltage $U_{POL}$ to provide the electrical current $I_{BT}$ output by the beam tube 2 at its output terminal 2I and supplied to the current input 3A of the electronic apparatus 3.

The cesium tube operation lifetime can be affected by different parameters including a metallic cesium quantity loaded by the cesium oven 2A, a vacuum pumping capacity and/or the amplification gain $G_{EM}$ of the electron multiplier 2F of the beam tube 2. The metallic cesium quantity loaded in the cesium oven 2A affects the cesium tube operation lifetime since by limiting the cesium oven operating temperature the useful cesium beam flux applied to the ionization detector 2E is limited. This allows to keep a sufficient flux for the clock operation lifetime but does limit the clock frequency stability.

Further, the cesium tube operation lifetime is affected by the vacuum pumping capacity (not illustrated in FIG. 2). Two pumping devices equip the cesium tube, graphite getters to trap the residual cesium atoms and an ion pump to trap other neutral gases, mainly air. The graphite getters quantity can be designed according to the cesium load quantity. The ion pump capacity can be designed according to the tube geometry and material. The cesium tube operation lifetime can be fairly well mastered for the actual tube geometry and the cesium load.

An important parameter affecting the operation lifetime of the beam tube 2 is the amplification gain $G_{EM}$ provided by the electron multiplier 2F of the beam tube 2. Operation of the beam tube 2 without the electron multiplier 2F is hardly feasible because of a too weak output signal $I_{BT}$ and an insufficient signal bandwidth. If the amplification gain $G_{EM}$ of the electron multiplier 2F becomes too weak the electronic gain $G_v$ of the variable voltage gain amplifier 3C in a conventional apparatus may not be able to compensate for an input current drop which results in a too weak final voltage signal for the electronic controller 3D. This results in an unwanted premature clock lifetime reduction of the atomic clock device although the cesium beam flux applied to the ionization detector 2E might still be sufficient.

Figure 3A:
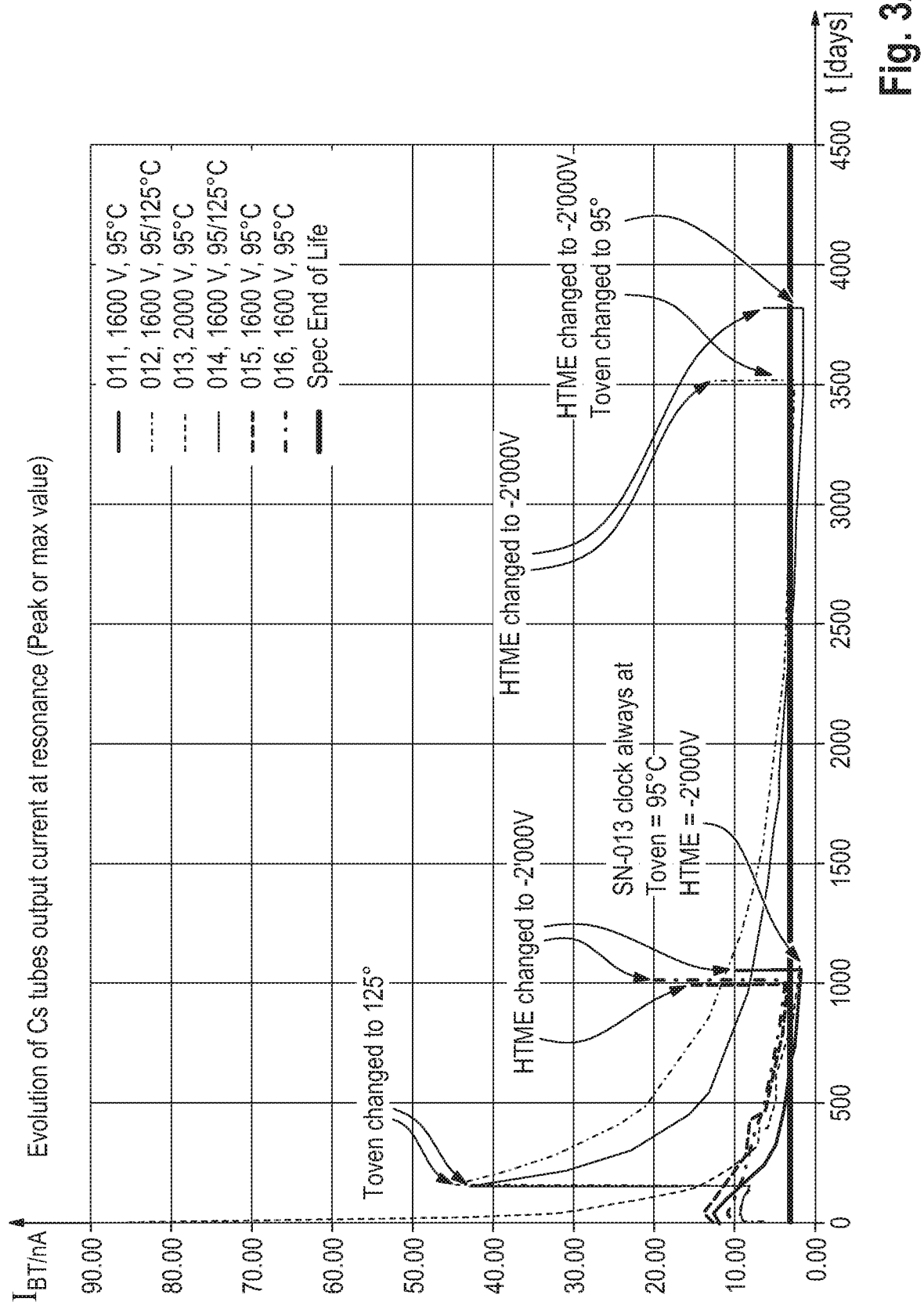

FIG. 3A shows a diagram illustrating an evolution over time t of the beam tube output current signal, i.e. the electrical current $I_{BT}$ output by the beam tube 2. For this test, several operational conditions have been investigated, in particular an effect of the electron multiplier polarization voltage $U_{POL}$ (1600 V and 2000 V) and the effect on the ion beam flux applied to the electron multiplier 2F by varying the cesium oven temperature T (95° C. and 125° C.). As can be seen from the FIGS. 3A, 3B, an output current slope of the output current $I_{BT}$ is not only depending on the electron multiplier polarization voltage $U_{POL}$ and its multiplier gain $G_{EM}$ but also on the oven temperature T. This is visible for a clock 012 and a clock 014 at the time t=150 days when their oven temperature T have been increased without changing the electron multiplier polarization voltage $U_{POL}$ which yields to a similar output current slope as a clock 013 operating at 2000 V in the initial days.

This observation becomes even more evident in FIG. 3B where the output current slope of the output current expressed in decibel per day is plotted not versus time but versus the output current $I_{BT}$. It can be seen from FIG. 3B that the higher the output current $I_{BT}$ is the steeper the current slope becomes. Below a specific current (5 nAmps in the illustrated example), the current slope becomes independent of the output current $I_{BT}$ which does correspond to a weak and steady-state aging process of the electron multiplier 2F of the beam tube 2. Physically, the electron multiplier aging is more driven by its output current $I_{BT}$ rather than by its multiplier gain $G_{EM}$. With the method and the apparatus 3 according to the present invention, the output current $I_{BT}$ is kept below a specified threshold $I_{th}$.

Based on the observations illustrated in FIGS. 3A, 3B, the method and apparatus 3 according to the present invention can provide two regulation loops for increasing the operation lifetime of the beam tube 2. First, the tube output current $I_{BT}$ is regulated at a value below a characteristic threshold $I_{th}$ by acting on the electron multiplier gain $G_{EM}$ and its polarization voltage $U_{POL}$. The gain $G_v$ of the variable amplifier 3C consequently operates at an almost constant value as the output current is constant. An exception might occur in an early stage of the operation tube lifetime in which even the lowest polarization voltage $U_{POL}$ might output a current having an amplitude higher than the characteristic threshold $I_{th}$. In this case, the gain $G_v$ can be reduced in order to keep the final voltage in a specified range.

In a further loop, when the maximum electron multiplier voltage has been reached the electron voltage is kept at its maximum value and the final voltage $V_2$ is regulated with the gain $G_v$ of the variable amplifier 3C by acting on its control signal $G_v$-CRTL. Although the output current $I_{BT}$ might keep decreasing over time (as no longer regulated), the current slope is sufficiently small and a sufficient margin remains between the threshold current $I_{th}$ and the minimum acceptable output current below which the output current $I_{BT}$ will become too small to normally operate the clock device 1.

In a possible embodiment, the operation lifetime of the beam tube 2 regarding the amplitude of the final voltage is determined to end when the final voltage signal $V_2$ does fall below a minimum limit with the maximum control signal on the electron multiplier 2F and the maximum gain $G_{vmax}$ on the variable amplifier 3C.

The method and the apparatus 3 according to the present invention increase significantly the operation lifetime of the beam tube 2 regarding the electron multiplier aging (typically by a factor 3). The method and the apparatus 3 according to the present invention do not require any hardware modification of the beam tube 2. With the method and the apparatus 3 according to the present invention, the electron multiplier gain $G_{EM}$ is actively controlled by its polarization high voltage in order to keep the beam tube output current $I_{BT}$ constant and at a low level, e.g. less than 10 nAmps, in particular at around 5 nAmps. First, the tube output current $I_{BT}$ is regulated at a value below the characteristic threshold value of e.g. 5 nAmps by acting on the electron multiplier polarization voltage $U_{POL}$. The voltage gain amplifier does so operate at a constant value. Second, when the maximum electron multiplier voltage has been reached the electron multiplier voltage is kept at its maximum value and the operating voltage $V_2$ is regulated using the voltage gain amplifier 3C.

The method and the apparatus 3 according to the present invention minimize the electron multiplier aging since the output current $I_{BT}$ always remains smaller than the characteristic threshold, e.g. 5 nAmps, while maintaining the clock performance, i.e. signal to noise ratio SNR and output frequency stability.

The invention claimed is:

1. A method for increasing an operation lifetime of a beam tube, BT, having an electron multiplier which amplifies a received ionic current with an electron multiplier gain, $G_{EM}$, to provide an electrical current ($I_{BT}$) output by the said beam tube, BT, wherein the electrical current ($I_{BT}$) output by the said beam tube, BT, is regulated by a controller to compensate for electron multiplier aging and to keep it below a characteristic current threshold, $I_{th}$, by adjusting an electron multiplier gain control signal ($G_{EM}$-CTRL) until it reaches a predefined maximum value, wherein the characteristic current threshold is less than 10 nAmps.

2. The method according to claim 1 comprising:
converting the electrical current ($I_{BT}$) output by the said beam tube, BT, into an intermediate voltage (V1).

3. The method according to claim 2, wherein the electrical current ($I_{BT}$) output by the said beam tube or the intermediate voltage (V1) is amplified by at least one amplifier to provide a voltage signal (V2) used for further processing and applied to a controller.

4. The method according to claim 1 comprising:
adjusting the electron multiplier gain, $G_{EM}$, of the electron multiplier by changing an electron multiplier polarization voltage ($U_{POL}$) applied to the said electron multiplier by a power supply unit controlled by an electron multiplier gain control signal ($G_{EM}$-CTRL) generated by the controller.

5. The method according to claim 3 comprising:
regulating by the controller the voltage signal (V2) applied to the controller by increasing a variable gain, $G_v$, of at least one voltage amplifier to compensate for a drop of the electrical current ($I_{BT}$) output by the said beam tube, BT, caused by the aging of the electron multiplier until the applied voltage signal (V2) reaches a predefined minimum value.

6. The method according to claim 1, wherein the characteristic current threshold is 5 nAmps.

7. An apparatus adapted to increase an operation lifetime of a beam tube, BT, having an electron multiplier which is adapted to amplify a received ionic current with an electron multiplier gain, $G_{EM}$, to provide an electrical current ($I_{BT}$) output by the said beam tube, BT,
the said apparatus comprising:

a controller adapted to regulate the electrical current $I_{BT}$ output by the said beam tube, BT, to compensate for the electron multiplier aging and to keep it below a characteristic current threshold, $I_{th}$, by adjusting an electron multiplier gain control signal ($G_{EM}$-CRTL) until it reaches a predefined maximum value;
wherein the characteristic current threshold is less than 10 nAmps.

8. The apparatus according to claim 7 comprising:
a trans-impedance amplifier adapted to convert the electrical current ($I_{BT}$) output by the beam tube, BT, into an intermediate voltage (V1) amplified by at least one voltage amplifier of the apparatus to provide a voltage signal (V2) used for further processing and applied to the controller of the apparatus.

9. The apparatus according to claim 7, wherein the controller is adapted to adjust the electron multiplier gain, $G_{EM}$, of the electron multiplier by changing an electron multiplier polarization voltage ($U_{POL}$) applied to the said electron multiplier (2F) by a power supply unit of the said apparatus in response to an electron multiplier gain control signal ($G_{EM}$-CRTL) generated by the controller.

10. The apparatus according to the claim 8, wherein the said controller is further adapted to regulate the voltage signal (V2) applied to the controller by increasing the variable gain, $G_v$, of at least one voltage amplifier to compensate for a further drop of the electrical current ($I_{BT}$) output by the beam tube, BT, caused by the aging of its electron multiplier until the voltage signal (V2) applied to the said controller reaches a predefined minimum value.

11. The apparatus according to claim 7, wherein the characteristic current threshold, $I_{th}$, is stored in a configuration memory of said apparatus and/or stored in a configuration memory of said beam tube, BT, wherein the characteristic current threshold, $I_{th}$, is 5 nAmps.

12. The apparatus according to claim 7, wherein the controller is further adapted to generate a control signal (MFS-CRTL) supplied to a microwave frequency synthesizer of the said apparatus adapted to generate a microwave frequency signal (MFS) applied to a microwave cavity of the beam tube, BT, wherein the microwave frequency synthesizer of the apparatus provides an atomic clock output signal (CLK) output by the said apparatus to a user.

13. The apparatus according to claim 12, wherein the beam tube, BT, comprises an oven adapted to provide a continuous atomic beam flux of atoms supplied to a state preparation magnet of the beam tube, BT, adapted to deflect selectively atoms of the atomic beam flux into a microwave cavity of the said beam tube, BT, receiving the microwave frequency signal (MFS) from the microwave frequency synthesizer of the apparatus controlled in response to a control signal (MFS-CRTL) generated by the controller of the said apparatus, wherein the atoms of the atomic beam flux deflected by the said state preparation magnet into the microwave cavity of the beam tube, BT, are supplied to a state detection magnet of the said beam tube, BT, adapted to deflect selectively atoms of the atomic beam flux to an ionization detector of the said beam tube, BT, wherein an atomic beam flux supplied by the state detection magnet of the beam tube, BT, to the ionization detector of the beam tube, BT, is converted by the ionization detector into an ionic current of charged ions amplified by the electron multiplier of the beam tube, BT, wherein the ionic current of charged ions is amplified by the electron amplifier of the beam tube, BT, with an electron multiplier gain, $G_{EM}$, adjusted by the controller of the said apparatus by changing the electron multiplier polarization voltage ($U_{POL}$) to provide the electrical current ($I_{BT}$) output by the beam tube, BT.

14. An atomic clock device comprising a beam tube, BT, and an apparatus adapted to increase the operation lifetime of the beam tube, BT, said apparatus comprising:
- a controller adapted to regulate the electrical current ($I_{BT}$) output by the said beam tube, BT, to compensate for the electron multiplier aging and to keep it below a characteristic current threshold, $I_{th}$, by adjusting an electron multiplier gain control signal ($G_{EM}$-CRTL) until it reaches a predefined maximum value,
- wherein the characteristic current threshold is less than 10 nAmps.

15. The atomic clock device according to claim 14, wherein the beam tube, BT, and/or the apparatus comprise a configuration memory which stores a characteristic current threshold, $I_{th}$, used by the controller of the apparatus to regulate the electrical current, $I_{BT}$, output by the beam tube, BT, of the atomic clock device.

16. The atomic clock device according to claim 14, wherein the beam tube, BT, is a cesium beam tube.

\* \* \* \* \*